United States Patent [19]
Piovano

[11] Patent Number: 5,584,788
[45] Date of Patent: Dec. 17, 1996

[54] MACHINE FOR MECHANICALLY MACHINING BOARDS, IN PARTICULAR PRINTED CIRCUIT BOARDS

[75] Inventor: Luigi Piovano, S. Giusto Canavese, Italy

[73] Assignee: Pluritec Italia S.p.A., Borgomanero, Italy

[21] Appl. No.: 334,661

[22] Filed: Nov. 4, 1994

[30] Foreign Application Priority Data

Nov. 5, 1993 [IT] Italy .................... T093A0832

[51] Int. Cl.⁶ .................... B23Q 1/46; B23B 39/16
[52] U.S. Cl. .................... 483/37; 408/43; 409/202; 409/212; 483/40
[58] Field of Search .................... 483/37, 55, 52, 483/56, 38, 54; 408/43, 50, 69, 52, 95, 42; 409/212, 202

[56] References Cited

U.S. PATENT DOCUMENTS

| | | | |
|---|---|---|---|
| 3,976,386 | 8/1976 | Marantette et al. | 408/43 |
| 4,088,417 | 5/1978 | Kosmowski | 408/52 X |
| 4,596,067 | 6/1986 | Raiteri | 408/43 |
| 4,865,494 | 9/1989 | Gudow | 408/95 |
| 4,922,603 | 5/1990 | Kosmowski | 403/56 |
| 4,982,831 | 1/1991 | Irie | 409/233 |
| 5,078,558 | 1/1992 | Arao | 198/617 |
| 5,230,685 | 7/1993 | Christen et al. | 483/55 |
| 5,265,986 | 11/1993 | Prokopp | 408/50 X |
| 5,354,153 | 10/1994 | Ottone et al. | 408/69 X |
| 5,407,416 | 4/1995 | Ottone et al. | 483/52 X |

FOREIGN PATENT DOCUMENTS

| | | |
|---|---|---|
| 0287071 | 10/1988 | European Pat. Off. . |
| 0362781 | 4/1990 | European Pat. Off. . |
| 0477766 | 4/1992 | European Pat. Off. . |
| 0563862 | 10/1993 | European Pat. Off. . |
| 3539662 | 5/1987 | Germany . |
| 3719167 | 11/1988 | Germany . |
| 8706167 | 10/1987 | WIPO . |

OTHER PUBLICATIONS

IBM Technical Disclosure Bulletin, vol. 31, No. 11, Apr. 1989, New York, US pp. 242–243.

Primary Examiner—William R. Briggs
Attorney, Agent, or Firm—Kenyon & Kenyon

[57] ABSTRACT

A machine presenting a worktable movable along a first axis; and a crosspiece fitted with a number of machining heads and movable along a second axis perpendicular to the first axis. The crosspiece presents a box structure, and two end portions guided on two horizontal appendixes of two fixed uprights. Between one of the appendixes and the corresponding end portion of the crosspiece, there is provided a screw-nut screw pair for selectively moving the crosspiece. Each machining head is assigned a tool store accessible from the rear of the machine.

12 Claims, 5 Drawing Sheets

MACHINE FOR MECHANICALLY MACHINING BOARDS, IN PARTICULAR PRINTED CIRCUIT BOARDS

BACKGROUND OF THE INVENTION

The present invention relates to a machine for mechanically machining boards, in particular printed circuit boards. More specifically, the present invention relates to a drilling or milling machine for simultaneously machining a number of packs of printed circuit boards by means of a corresponding number of machining heads.

Machines of the aforementioned type are known wherein the worktable travels along a longitudinal axis, normally referred to as the Y axis, and the machining head is fitted to a carriage sliding transversely on a fixed crosspiece along the so-called X axis. In view of the low output of which they are capable, however, such machines are unsuitable for mass production applications.

As is known, the electronic circuit industry demands an ever-increasing number of printed circuit boards which feature a large number of holes requiring highly accurate, but at the same time low-cost, machining. Drilling machines have therefore been devised featuring a number of drilling heads for simultaneously machining respective packs of printed circuit boards on a single worktable.

One known drilling machine features a number of machining heads on a crosspiece fixed to the machine bed; and the worktable is moved selectively along the horizontal X and Y axes, so that it is extremely complex and expensive in design.

Another machine for drilling printed circuit boards features a fixed worktable, and the crosspiece supporting the machining heads travels along the longitudinal Y axis. The crosspiece supports two machining heads traveling transversely along the crosspiece, connected transversely to each other, and moved along the Y axis by a common drive device.

This type of machine presents several drawbacks, foremost of which are the impossibility of maintaining a precise constant distance between the two connected machining heads; the impossibility of fitting the crosspiece with more than two machining heads; and, finally, the difficulty posed by longitudinal displacement of the crosspiece.

SUMMARY OF THE INVENTION

It is an object of the present invention to provide a machine for machining boards, in particular printed circuit boards, featuring a number of machining heads, which is extremely reliable and straightforward in design, and which provides for overcoming the aforementioned drawbacks typically associated with known machines.

According to the present invention, there is provided a machine comprising a bed on which a worktable is movable selectively along a first axis; and a number of machining heads fitted to a crosspiece and aligned in a direction perpendicular to said first axis; said worktable being adapted to bring a number of boards or packs of similar boards to, and for simultaneous machining by, said machining heads; characterized in that said crosspiece is movable selectively along a second axis parallel to said direction.

BRIEF DESCRIPTION OF THE DRAWINGS

A preferred non-limiting embodiment of the present invention will be described by way of example with reference to the accompanying drawings, in which.

DETAILED DESCRIPTION OF THE INVENTION

Figure 1:
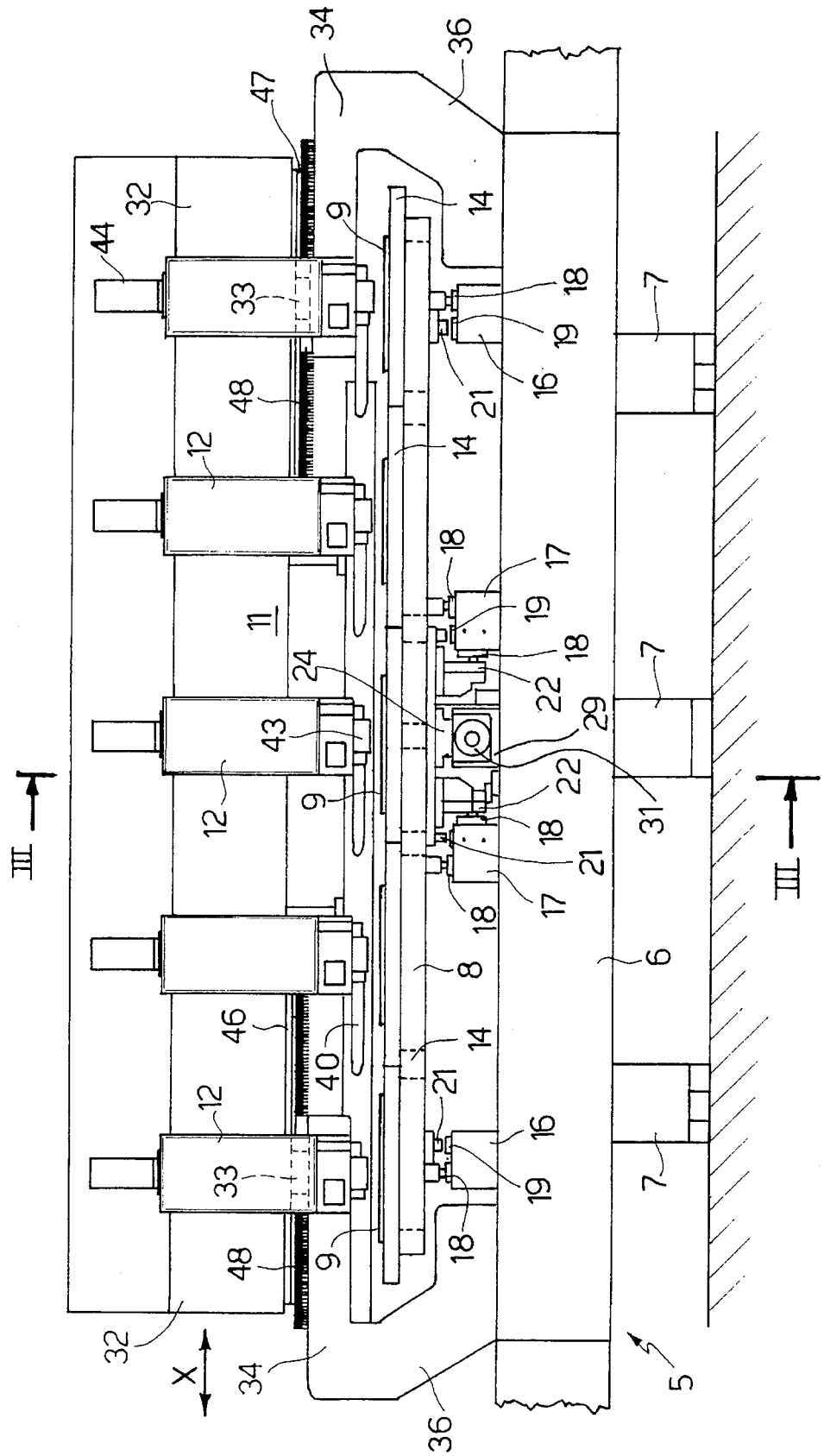
FIG. 1 shows a front view of a machine for mechanically machining boards, in accordance with the present invention.

Number 5 in FIG. 1 indicates the bed of a machine for mechanically machining boards, in particular printed circuit boards; bed 5 comprising a strong horizontal block 6 preferably made of granite and resting on a number of supports 7. The machine also comprises a worktable 8 for supporting a series of five packs of boards 9 to be drilled or milled simultaneously.

Each pack of boards 9 comprises a number of boards or printed circuit boards made of fiberglass-reinforced plastic and coated with a layer of conductive metal; and packs 9 are aligned a predetermined distance apart, and preferably equidistant, in a direction parallel to axis X.

Figure 3:
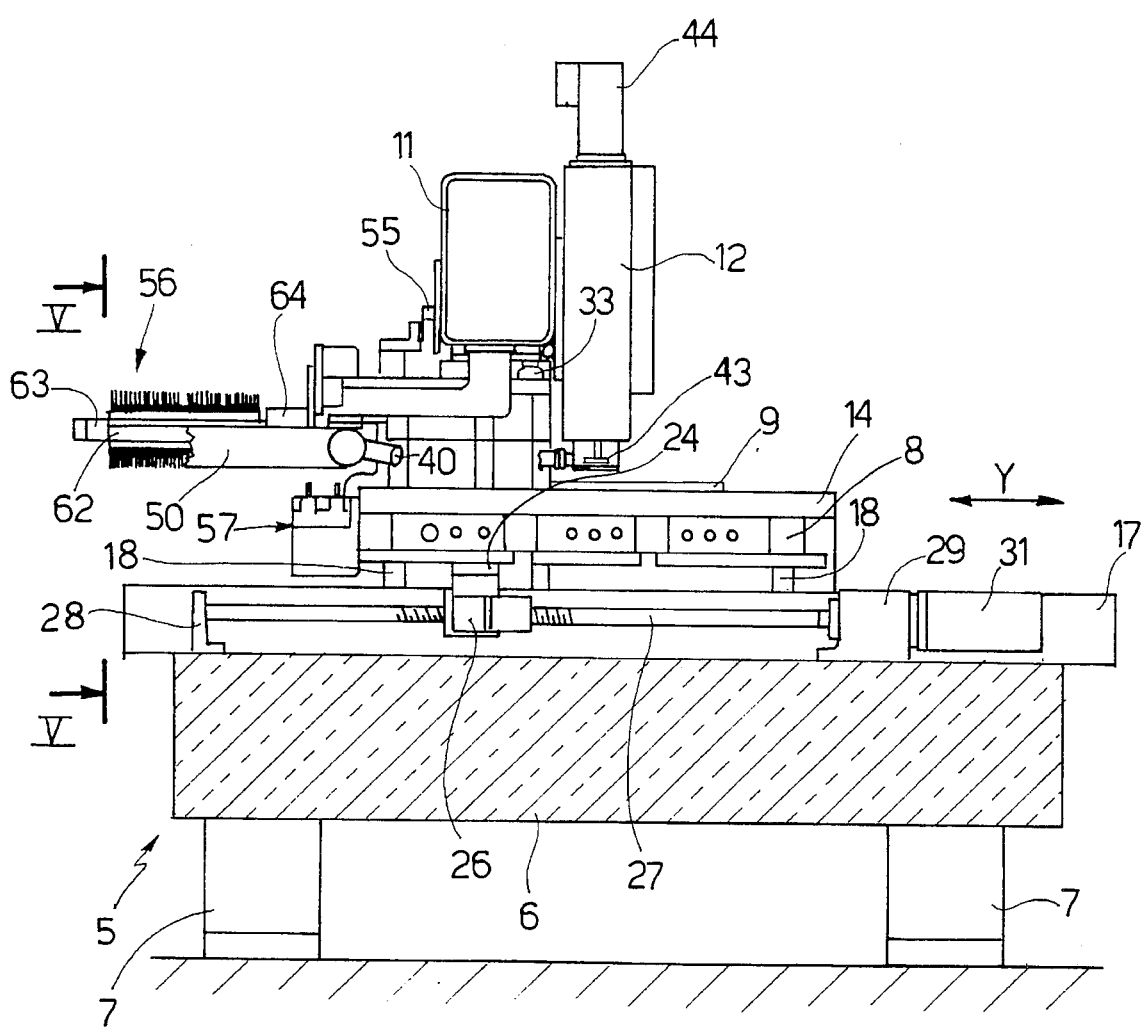
FIG. 3 shows a section along line III—III in FIG. 1.

The machine also comprises a rectangular-section crosspiece 11 (FIG. 3) supporting a number of machining heads 12, e.g. five drilling heads, for packs 9 on worktable 8. Machining heads 12 are therefore aligned in said direction parallel to axis X, and arranged the same predetermined distance apart as for packs 9.

Worktable 8 presents a reticulated structure of welded hollow rectangular or square sections, and is fitted with five fixtures 14 for securing packs 9 in known manner. Block 6 of bed 5 is fitted with two outer and two inner prismatic bars 16 and 17 also made of granite and extending longitudinally along axis Y.

Worktable 8 is fitted underneath with four pairs of air-cushion pads 18 by which it travels over the upper surface of bars 16 and 17, and each bar 16, 17 is fitted along its full length with a bar 19 of magnetic material. Close to each pad 18, worktable 8 presents a respective permanent magnet 21 so positioned as to form a small air gap with bar 19 without ever touching it. The force by which the magnets attract bars 19 is such as to preload pads 18 and eliminate any in-service variation in the supporting passage.

Worktable 8 is also fitted underneath with two pairs of supports 22 extending downwards and each fitted with an air-cushion pad 18 which engages a respective vertical surface of an inner bar 17 so as to guide worktable 8 along axis Y. Finally, worktable 8 presents a central support 24 (FIG. 3) in which is fitted a recirculating-ball nut screw 26 engaging a screw 27 mounted for rotation on a pair of supports 28, 29 on block 6 of bed 5. Support 29 is fitted with a numerical-control reversible electric motor 31, the shaft of which is connected to screw 27 to move worktable 8 selectively along axis Y.

Figure 4:
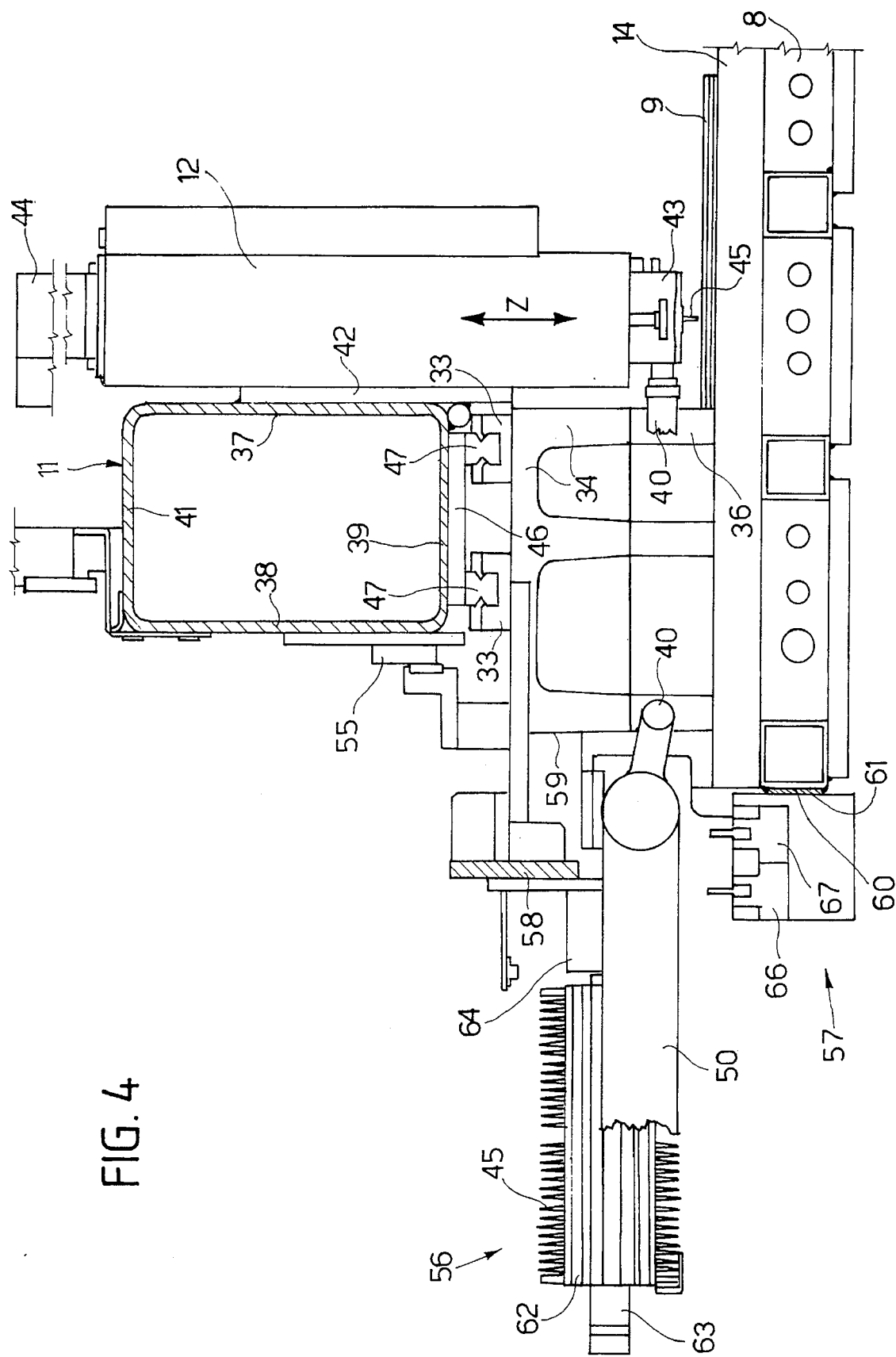
FIG. 4 shows a larger-scale portion of the FIG. 3 section.

According to the invention, crosspiece 11 is movable transversely along axis X. More specifically, crosspiece 11 comprises two end portions 32 (FIGS. 1 and 4), each guided by a pair of fixed guides 33. Each pair of guides 33 is supported on a respective horizontal appendix or bracket 34 formed in one piece with a respective strong cast iron upright 36 fitted to block 6 of bed 5. As the travel of crosspiece 11 never exceeds the distance between adjacent machining heads 12, the length of each bracket 34 is substantially defined by said distance, so that the central portion of the machine presents a wide gap between brackets 34 and over worktable 8.

Crosspiece 11 (FIG. 4), being made of two opposed sheet metal channel sections welded to each other to form a rectangular-section box structure, is relatively lightweight, and presents two vertical walls 37, 38, and two horizontal walls 39, 41. Each machining head 12 is fitted in known manner to a plate 42 in turn fitted, e.g. welded, to the front vertical wall 37 of crosspiece 11.

Figure 2:
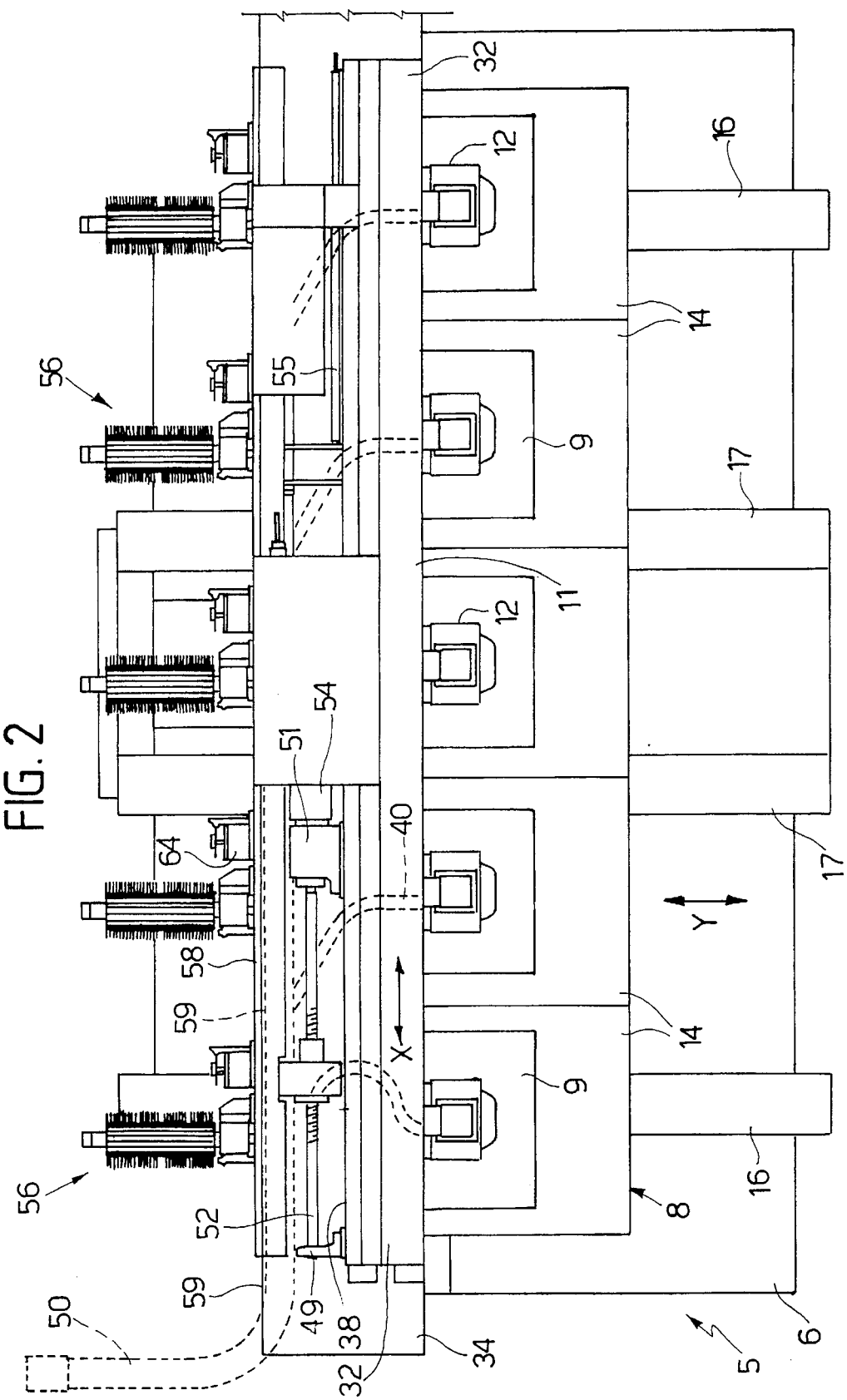
FIG. 2 shows a plan view of the FIG. 1 machine.

Each machining head 12 comprises a normal tool spindle 43 rotated at high speed by an integrated electric motor, and which is fitted to a structure (not shown) moved vertically along axis Z by a further, reversible numerical-controlled, electric motor. Spindle 43 is fitted with a tool 45, which may be a drill or a cutter, and each machining head 12 comprises a chip suction hose 40 connected, together with the other hoses 40, to a main conduit 50 (FIG. 2).

At each end portion 32, the bottom wall 39 of crosspiece 11 presents a plate 46 (FIG. 1) fitted with two prismatic, substantially X-section bars 47 (FIG. 4), each engaging in sliding manner a respective fixed guide 33 which, though short, is a known high-precision type.

More specifically, each guide 33 comprises at least two sets of balls arranged so as to engage at least two respective flat surfaces of bar 47. Advantageously, the balls engage the bottom horizontal surface, a vertical surface, and an inclined surface of bar 47 which is thus guided on three sides. The pair of bars 47 at each end portion 32 is also protected by a respective bellows type cover 48 (FIG. 1).

Figure 5:
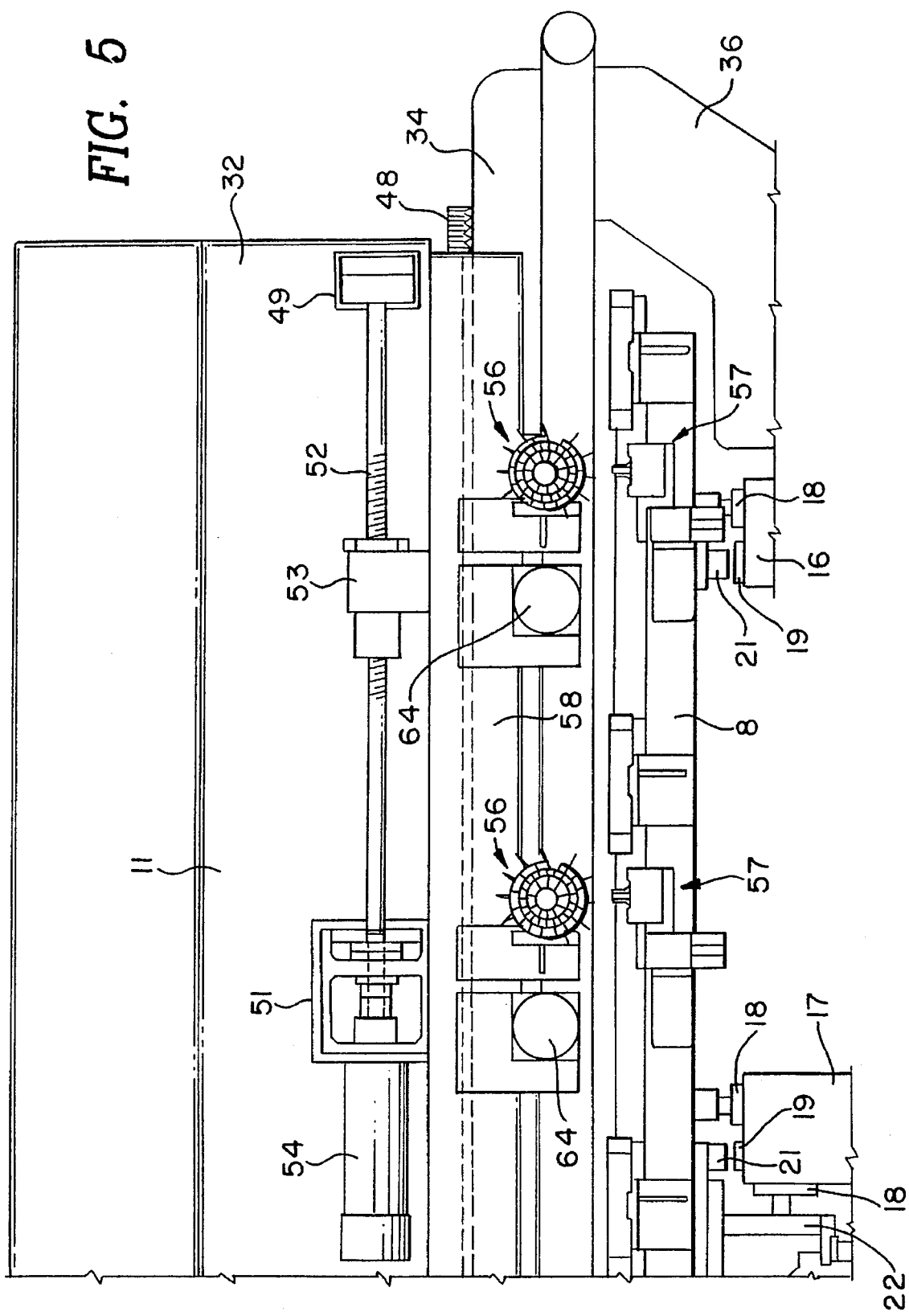
FIG. 5 shows a partial view along line V—V in FIG. 3.

At the left-hand end portion 32 (FIG. 2), the rear vertical wall 38 of crosspiece 11 is fitted with two supports 49 and 51 (FIG. 5) in which rotates a drive screw 52 engaging a recirculating-ball nut screw 53 fitted to respective bracket 34.

Support 51 is fitted with a reversible numerical-control electric motor 54, the shaft of which is connected to screw 52 for selectively moving crosspiece 11, together with machining heads 12, along axis X. At the right-hand end portion 32 (FIG. 2), wall 38 is fitted with a normal linear position transducer 55 for controlling displacement along axis X.

Each machining head 12 is provided with a respective store 56 for tools 45, and a respective device 57 (FIG. 5) for automatically changing tools 45 in spindle 43. According to one characteristic of the invention, stores 56 are mounted on a transverse bar 58 fixed to the rear edge 59 of the two brackets 34, i.e. to the edge 59 of brackets 34 opposite the front wall 37 of crosspiece 11; and tool-change devices 57 are fixed to a plate 60 welded to the rear edge 61 of worktable 8.

More specifically, store 56 substantially comprises a drum 62 fitted removably to a shaft 63, the axis of which is parallel to axis Y and lies in the same vertical plane as corresponding device 57. Drum 62 is held axially in position on shaft 63 by a permanent magnet (not shown).

Drum 62 houses twelve radial rows of tools 45, each row composed of two blocks of fifteen tools 45; and the tools 45 in each block may be housed in respective seats in a container or holder insertable directly inside the radial seat on drum 62. Shaft 63 is connected in known manner to a respective electric motor 64 by which it is rotated selectively to move a given row of tools 45 into the bottom tool-change position facing respective device 57.

Each tool-change device 57 substantially comprises two grippers 66 and 67 (FIG. 4) positioned a given distance apart, parallel to axis Y, and operating in the vertical plane of the axis of shaft 63. Gripper 66 provides for removing the used tool 45 from spindle 43 and replacing it inside its seat on drum 62, and gripper 67 for withdrawing the new tool 45 from its seat on drum 62 and inserting it inside spindle 43.

Store 56 and device 57 are substantially the same as those described in Italian Patent Application n. TO91A 000856 filed on 8 Nov. 1991, by the present Applicant. Once crosspiece 11 is moved into the tool-change position, i.e. with spindles 43 in the same vertical plane as the axis of shaft 63, the movements for bringing grippers 66 and 67 up to the selected tool 45 and spindle 43 for changing tool 45 are performed exclusively by worktable 8.

The tool-change cycle is therefore performed in exactly the same way as in Patent Application n. TO91A 000856 and requires no further description. Drum 62 is also changed in the same way as in the above patent application, but working from the rear of the machine, thus leaving the front clear for loading packs of boards 9 on to worktable 8.

The advantages of the present invention are as follows. Worktable 8 is greatly simplified by virtue of moving in only one direction; and the overall width of the machine is substantially reduced to the distance between the two uprights 36.

Moreover, crosspiece 11 supporting machining heads 12 is extremely lightweight and does not require the traditional bridge incorporating the fixed cross guide; crosspiece 11 is guided by ball elements 33 of limited length fixed to brackets 34 of uprights 36; and tool drum 62 is changed easily from the rear of the machine, leaving the front of the machine clear for loading and unloading packs of boards 9.

Clearly, changes may be made to the machine as described and illustrated herein without, however, departing from the scope of the present invention. For example, crosspiece 11 may present other than a box structure, and may be fitted with a different number of machining heads 12; tool store 56 may be in the form of a straightforward holder or matrix; tool-change device 57 may comprise only one gripper performing both operations successively; and the machine structure featuring a crosspiece fitted with a number of machining heads may be applied to other machine tools for machining other parts.

I claim:

1. A machine for mechanically machining boards, in particular printed boards, comprising: a bed on which a worktable is movable selectively along a first axis; and a number of machining heads fitted to a crosspiece and aligned in a direction perpendicular to said first axis; said worktable being adapted to bring a number of boards or packs of similar boards to, and for simultaneous machining by, said machining heads; said crosspiece including two end portions guided by at least a pair of guides fixed to said bed for movement along a second axis parallel to said direction; a recirculating-ball screw-nut screw pair provided between said crosspiece and said bed for selectively moving said crosspiece along said second axis; said crosspiece being made of welded sheet metal with a box section; said machining heads being fixed to a vertical wall of said crosspiece; said end portions each providing a prismatic element guided by said corresponding guide in said pair.

2. A machine as claimed in claim 1, characterized in that said machining heads are spaced apart at a predetermined distance on said crosspiece; the travel of said crosspiece along said second axis corresponding to said distance.

3. A machine as claimed in claim 1, characterized in that each guide in said pair is fitted to a horizontal appendix of a respective upright fixed to said bed.

4. A machine as claimed in claim 3, characterized in that the screw of said screw-nut screw pair is mounted for rotation on said crosspiece and operated by a numerical-control electric motor; the nut screw of said screw-nut screw pair being fixed to one of said appendixes.

5. A machine as claimed in claim 1, characterized in that each guide in said pair presents at least two series of rolling elements engaging at least two corresponding flat surfaces of said prismatic element.

6. A machine as claimed in claim 1, characterized in that said prismatic element presents a substantially X-shaped section and is protected by a bellows type cover.

7. A machine as claimed in claim 1, wherein said number of machining heads is associated a corresponding number of tool stores and a corresponding number of automatic tool-change devices; characterized in that said stores and said devices are fixed to the edge of said appendixes and of said worktable opposite said vertical wall.

8. A machine as claimed in claim 7, characterized in that each said store comprises a drum radially housing a number of rows of tools; said drum being rotated selectively on a shaft parallel to said first axis, for selecting one of said rows of tools; and said drum being accessible from said opposite edge for removable assembly on to said shaft.

9. A machine as claimed in claim 7, characterized in that each said device comprises gripper means for withdrawing the selected tool from said store and presenting it to the corresponding machining head; said gripper means being brought to the selected tool in one row and to the relative machining head by the movement of said worktable along said first axis.

10. A machine as claimed in claim 1, wherein, between said worktable and said bed, there is provided a second recirculating-ball screw-nut screw pair for selectively moving said worktable along said first axis; characterized in that said worktable is guided by means of air-cushion pads; at least some of said pads being preloaded by means of permanent magnets acting on an element of magnetic material.

11. A machine for mechanically machining boards, in particular printed circuit boards, comprising a bed on which a worktable is movable selectively along a first axis, and a number of machining heads fitted to a crosspiece and aligned in a direction perpendicular to said first axis, said work table being adapted to bring a number of boards or packs of similar boards to, and for simultaneous machining by, said machining heads; said crosspiece comprising two end portions guided by at least a pair of guides for selectively moving said crosspiece along a second axis parallel to said direction, each one of said guides being fitted to a horizontal appendix of a respective upright fixed to said bed; each said end portion being provided with a prismatic element guided by said corresponding guide in said pair; each said prismatic element having a bottom horizontal surface, a vertical surface and at least an inclined surface; each said guide having three series of rolling elements, each series engaging respectively said horizontal surface, said vertical surface and said inclined surface.

12. A machine for mechanically machining boards, in particular printed circuit boards, comprising a bed on which a worktable is movable selectively along a first axis, and a number of machining heads fitted to a crosspiece and aligned in a direction perpendicular to said first axis, said work table being adapted to bring a number of boards or packs of similar boards to, and for simultaneous machining by, said machining heads; said crosspiece being made of welded sheet metal with a box section, including a bottom wall, two vertical walls and a top wall; said machining heads being fixed to one of said vertical walls; said crosspiece comprising two end portions in correspondence of which said bottom wall carries two plates, each said plate being fitted with a pair of prismatic bars; and a pair of guides fitted to a horizontal appendix of a respective upright fixed to said bed for guiding said pair of bars to move said crosspiece along a second axis parallel to said direction.

* * * * *